US006271671B1

(12) United States Patent
Charles, Jr. et al.

(10) Patent No.: US 6,271,671 B1
(45) Date of Patent: Aug. 7, 2001

(54) MULTI-CHIP MODULE TESTABILITY USING POLED-POLYMER INTERLAYER DIELECTRICS

(75) Inventors: Harry K. Charles, Jr., Laurel; Deborah M. Mechtel, Columbia; A. Shaun Francomacaro, Eldersburg, all of MD (US)

(73) Assignee: The Johns Hopkins University, Baltimore, MD (US)

(*) Notice: Subject to any disclaimer, the term of this patent is extended or adjusted under 35 U.S.C. 154(b) by 0 days.

(21) Appl. No.: 09/416,073

(22) Filed: Oct. 12, 1999

Related U.S. Application Data

(60) Provisional application No. 60/104,145, filed on Oct. 14, 1998.

(51) Int. Cl.$^7$ .................. G01R 31/308; G01R 31/02; G01R 31/26; H01L 23/48
(52) U.S. Cl. .................. 324/753; 324/754; 438/15; 438/16; 257/760
(58) Field of Search .................. 324/754, 753; 257/759, 760; 438/16, 17, 45, 15

(56) References Cited

U.S. PATENT DOCUMENTS

| | | | |
|---|---|---|---|
| 5,394,098 | * | 2/1995 | Meyrueix et al. .................. 324/750 |
| 5,539,080 | * | 7/1996 | Hogan et al. .................. 528/353 |
| 5,872,360 | * | 2/1999 | Panniccia et al. .................. 250/341.4 |

* cited by examiner

*Primary Examiner*—Safet Metjahic
*Assistant Examiner*—Anjan K Deb
(74) *Attorney, Agent, or Firm*—Carla Magda Krivak

(57) ABSTRACT

The present invention improves multi-chip module (MCM) testability by using a new technique to detect on-substrate electric field strength. The invention employs a non-invasive, laser-based instrument to probe the MCM structures fabricated with poled polyimide interlayer dielectrics and thin film metallizations on silicon carriers. Circuit element characteristics of MCMs are probed with laser to detect electric field strength. The electrical, mechanical and optical properties of the electro-optical dielectric layers are determined to investigate the effect of the poling and processing operations on the efficacy of the polyimide as both a dielectric layer and an electro-optic material suitable for laser probing.

11 Claims, 9 Drawing Sheets

MULTI-CHIP MODULE TESTABILITY USING POLED-POLYMER INTERLAYER DIELECTRICS

CROSS REFERENCE TO RELATED APPLICATION

This Application claims priority from U.S. Provisional Application No. 60/104,145, filed Oct. 14, 1998, which is incorporated by reference in its entirety.

STATEMENT OF GOVERNMENTAL INTEREST

This invention was made with Government support under Contract No. N00039-95-C-0002 awarded by the Department of the Navy. The Government has certain rights in the invention.

BACKGROUND OF THE INVENTION

1. Field of the Invention

The present invention is a laser based solution for non-invasive high-speed testing of multi-chip modules (MCMs) and more particularly to using a chromophore-doped polyimide as an interlayer dielectric in a multi-level thin film metallized circuit structure. The dielectric is converted into an electro-optic material by poling the device in a strong electric field. The change in the electro-optic coefficients of the chromophore-doped polyimide in the presence of electrical signals in the circuit can be detected using a laser beam. The electro-optic interaction between the poled dielectric and the laser beam allows the strength of the internal fields within the MCM to be determined as a function of position.

2. Description of the Related Art

The ability to perform in situ testing and characterization of both integrated circuits and their interconnecting substrates in complex multi-chip packaging structures is becoming increasingly important as the packages become smaller.

Electro-optic probing relies on the change in the index of refraction of a material in the presence of an electric field (linear electro-optic effect). The linear electro-optic effect was first studied in crystalline solids belonging to crystal classes that lack a center of inversion symmetry. Gallium Arsenide (GaAs) and Indium Phosphide (InP) are examples of common semiconductor materials that exhibit this effect. Certain organic polymers when doped with non-linear moites and poled are also non-centrosymmetric and therefore exhibit the electro-optic effect. Doped organic polymers are poled by insertion into a strong electric field as the polymer is heated to near its glass transition temperature.

An electro-optic probing instrument makes point-to-point electric field measurements internal to microwave circuits instead of limiting the information to that gathered at the input or output ports of a circuit. The technique has been widely demonstrated with semiconductor substrates such as GaAs and InP. However, a substrate of silicon (Si) cannot be tested because it has a center of inversion symmetry. Although this technique is popular and polyimide is an increasingly popular organic polymer used in advanced packaging applications for high-speed circuits such as MCMs, no one has extended the application of electro-optic probing to circuit structures on polyimide and compared the results to more conventional substrates used for electro-optic probing such as GaAs and InP to demonstrate the potential to non-invasively probe circuit structures that are buried in central layers of an MCM as is proposed in the present invention.

SUMMARY OF THE INVENTION

It is an object of the present invention to provide a non-invasive electro-optic probing of standard circuit structures by converting integral layers into an electro-optic material.

It is another object of the present invention to selectively convert predefined regions of the circuit structure.

It is a further object of the present invention to use chromophore-doped polyimides as an interlayer dielectric in a multilevel circuit structure.

It is yet another object of the present invention to selectively change the amount of poling and the chromophore density of the layers in the circuit structure to develop unique signatures even in deeply buried circuit elements.

It is still a further object of the present invention to detect the change in a material's electro-optic coefficients in the presence of electrical signals using a laser beam, continuous wave (CW) or pulsed.

It is a further object of the present invention to develop suitable polymers for high-density packaging, such as multi-chip module-doped (MCM-Ds) packages, that are capable of being probed non-invasively by electro-optic probing techniques.

These objects are achieved by providing a multi-chip module circuit structure including a substrate, a metal layer formed on the substrate, a plurality of chromophore doped polyimide interlayer dielectric layers formed on the metal layer, and patterned metal conductors formed on each of the plurality of chromophore doped polyimide interlayer dielectric layers. The substrate can be silicon and can include p-type, boron doped, (100) orientation having a resistivity between 25–30 ohm-cm and a thickness between 14.0–16.0 $\mu$m. The chromophore doped polyimide interlayer dielectric layers can include, for example, a polyimide of Ultradel 9020D doped with 4-(dicyanomethylene)-2-methyl-6-(p-dimethylaminostyryl)-4H-pyran (DCM).

The present invention also includes a method for improving testability of a multi-chip module circuit structure including the steps of forming a multi-chip module circuit structure including a plurality of chromophore doped polyimide dielectric layers formed on a metal layer and substrate, forming patterned metal conductors on or near each of the plurality of chromophore doped polyimide dielectric layers, poling the chromophore doped polyimide dielectric layers in a strong electric field, and focusing a laser probe on each of the patterned metal conductors for diagnosing module performance.

These objects, together with other objects and advantages which will be subsequently apparent, reside in the details of construction and operation as more fully described and claimed hereinafter, reference being had to the accompanying drawings forming a part hereof, wherein like reference numerals refer to like parts throughout.

DESCRIPTION OF THE PREFERRED EMBODIMENTS

Figure 1:
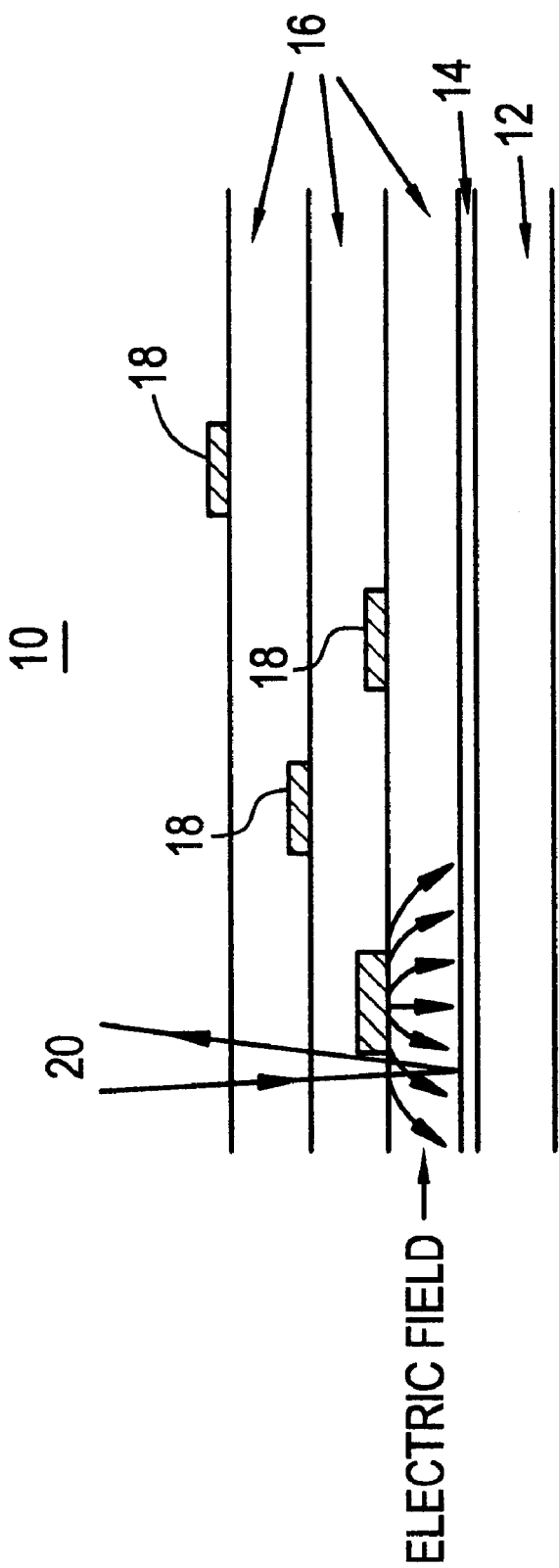
FIG. 1 is a thin film multi-chip module circuit structure according to the present invention.

The present invention is a multi-chip module (MCM) in which the dielectric layers therein are converted into electro-optic material. FIG. 1 shows a thin film multi-chip module 10 (MCM) circuit structure according to the present invention. In FIG. 1, a silicon substrate 12 has a metal layer 14 formed thereon. Layers of chromophore doped polyimide 16 are then formed on the metal layer 14. Patterned metal conductors 18 are formed on each of the chromophore doped polyimide layers 16. The device 10 is then probed with a laser 20. The substrate 12 (dielectric) is made with polyimide with the addition of a chromophore (a photosensitive radical) to make it electro-optically sensitive and therefore, can be laser probed. Under the influence of a strong electric field, the multi-chip module 10 becomes electro-optic. Types of chromophores that can be used are 4-(dicyanomethylene)-2-methyl-6-(p-dimethylaminostyryl)-4H-pyran (DCM). Although there are commercially photosensitive polymers on the market that are then developed, there are none that are electro-optically sensitive. The present invention allows an MCM 10 to be tested using a non-invasive technique such as a laser for diagnosing module performance, locating sites of circuit shorts and opens and determining the efficacy of field containment structures. By changing the strength of the poling field and the chromophore density of the layers, coupled with the changes in the electric field of the circuit under test and laser light intensities, unique signatures can be developed from even deeply buried circuit elements. That is, the electro-optic interaction between the poled dielectric 16 and the laser beam 20 allows the strength of the internal fields within the MCM 10 to be determined as a function of position. Further, the material can be selectively converted in predefined regions.

The present invention provides certain organic polymers that when doped with non-linear moieties and poled, exhibit the electro-optic effect. The doped organic polymers are poled by insertion into a strong electric field as the polymer is heated to near its glass transition temperature. When tested by an electro-optic probing instrument the instrument responds to a change in index of refraction of the poled dielectric layers produced by the electrical signals in the circuit. These changes are dependent on the size of the electro-optic coefficients and the strength and spatial extent of the internal field associated with the signal.

Particular attention has been paid to demonstrating the potential for this new and novel measurement technique and also to the requirements for MCM-D (multi-chip module-doped) fabrication.

Typical polymers that exhibit the electro-optic effect after poling include conditioned photosensitive polymers such as poly-methyl methacrylate (PMMA). While these polymers are common in the processing of semiconductor wafers, they are typically not part of the packaging structure. Since polyimide is the major dielectric layer of choice for organic thin-film MCMs, the present invention is focused on polyimide doped with non-linear optical chromophores that are then poled to exhibit the electro-optic effect.

Figure 2:
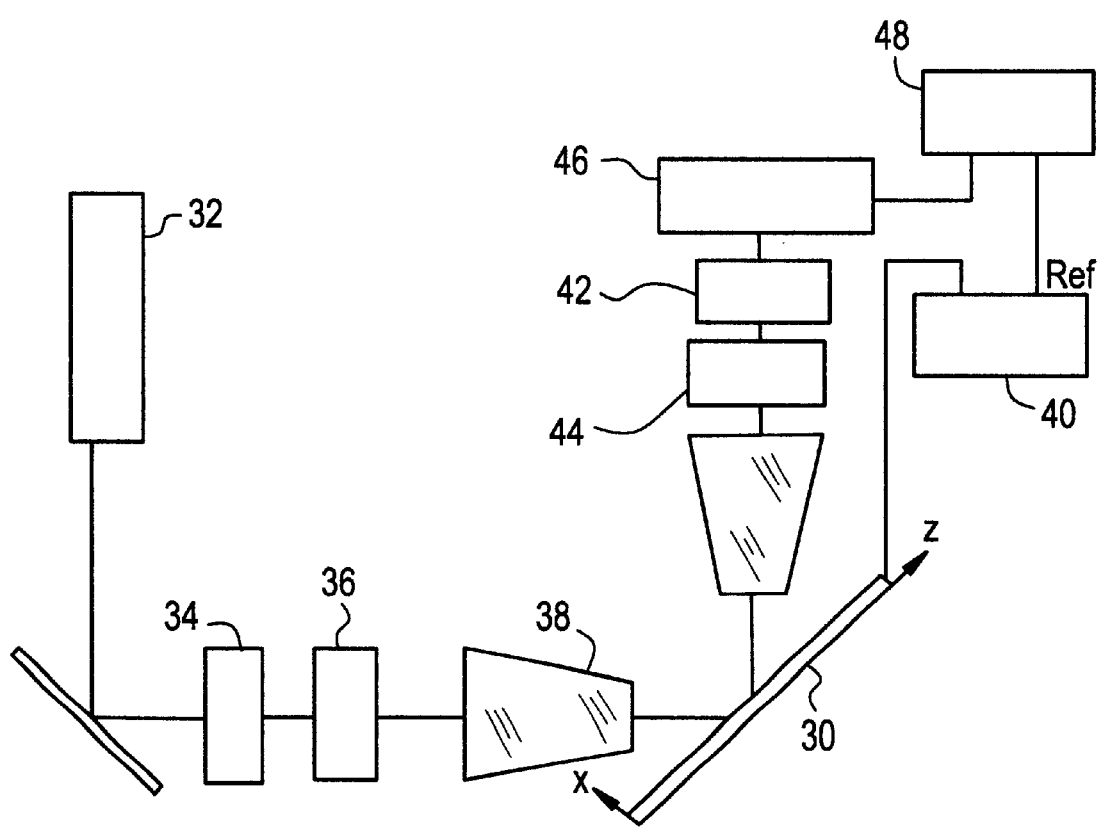
FIG. 2 is a schematic block diagram of an electro-optic probing instrument for testing polyimide samples according to the present invention.

FIG. 2 is a diagram of a basic set-up for electro-optic probing of the electric field in a test substrate 30 with an RF signal present in the circuit. The basic set-up may be extended for signals at microwave (10 GHz) frequencies. A 1300 nm diode 32 laser source and polarizer 34 shown in FIG. 2 produces linearly polarized light that is used to probe the voltage along the circuit lines of the substrate 30, e.g., to probe the electric field internal to the substrate 30. A half-wave plate 36 controls the orientation of the linearly polarized light as it enters the sample 30. The diameter of the light beam incident on the sample defines the area probed. Hence, the smallest spot size is diffraction limited. The instrument shown in FIG. 2 uses a focusing lens 38 to achieve a spot size of approximately 1 $\mu$m. Within the test substrate 30, the linearly polarized light may be modeled as two orthogonal polarization components each of which experiences a different index of refraction as a result of the effect of the high-frequency electric field on the substrate's indices of refraction. The electric signal applied to the sample by a signal generator 40 changes the index of refraction of the sample at the frequency of the applied electric signal. The magnitude of the change in the index of refraction is proportional to the size of the electro-optic coefficient for the material, with the electro-optic coefficient established by the poling process for the polyimide sample. The change in index of refraction is related to the strength of the high-frequency electric field by the electro-optic coefficient, a material constant. As a result of the polarization components experiencing different indices of refraction, a phase delay that is proportional to the strength of the electric field at the probed point is introduced between the polarization components of the probe light beam passing through the substrate 30. The probing laser 32 light is reflected off the ground plane of the test substrate 30. Subsequent passage through an analyzer 42 permits the intensity modulation present on the probing laser 32 beam to be related to the voltage present at the point probed by the laser beam on the microwave circuit substrate 30. A quarter-wave plate 44 biases the system for linear operation. A photodetector 46 is used to detect the variations in laser intensity created by the high-frequency electric field present in the circuit. The signal from the photodetector 46 is received by a lock-in amplifier 48. The lock-in amplifier 48 is capable of detecting low voltage levels with a phase locked loop that uses the signal generator 40 to provide a reference signal.

The polymer of the present invention is sandwiched between two metal electrodes during the poling process where the electrode's planes are perpendicular to the x-axis of the sample 30 shown in FIG. 2. For a poled polymer, the two orthogonal polarization components of the probe beam 32 are oriented in the z and y directions so that each experiences a different index of refraction due to the effect of the electric field in the polymer sample 30. Thus, as shown in FIG. 2, the sample 30 may be oriented at a 45° angle to probe for voltage levels in the polymer. The probe beam 32 is linearly polarized and oriented at 45° to the y-axis by the half-wave plate 36. The applicable electro-optic coefficients are $r_{13}$ and $r_{33}$. For GaAs and InP, the $r_{41}$ electro-optic coefficient is applicable.

Figure 3:
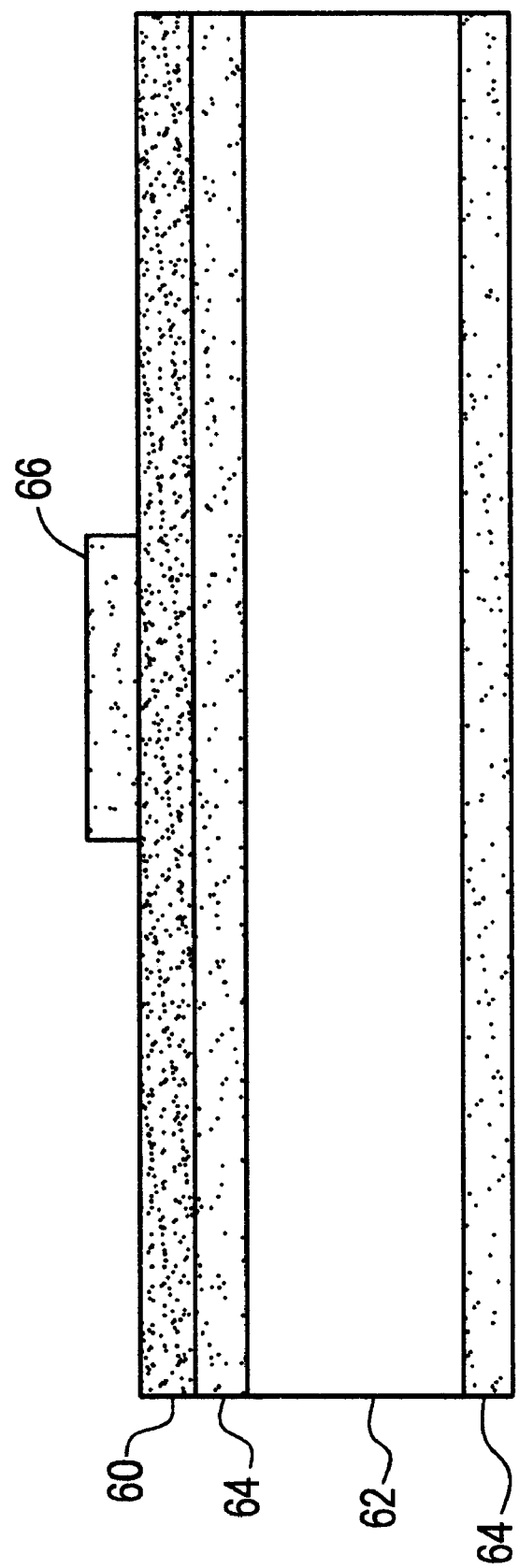
FIG. 3 is a cross section of a polyimide test sample used in the present invention.

A series of test samples of chromophore doped polyimides 60 were constructed on silicon wafers 62, as shown in FIG. 3, with the following specifications: p-type, boron doped, (100) orientation, resistivity 25–30 ohm-cm and 14.0–16.0 $\mu$m thick. A layer of metal 64, such as, for example, but not limited to, Al, was deposited by sputtering onto a silicon substrate 62 followed by two layers of spin-coated polyimide 60. Finally, an additional layer of metal 66, such as, for example, but not limited to, Al, was deposited in preparation for poling. As an example, the polyimide used was Ultradel 9020D (product supplied by Amoco Chemical Company) doped with, for example, 4-(dicyanomethylene)-2-methyl-6-(p-dimethylaminostyryl)-4H-pyran (DCM) (product supplied by Exciton, Inc.), a non-linear optical chromophore. However, any type of chromophore and appropriate dopant can be used. In this case, the polyimide had 8.4% total solids with up to 17.5% DCM by weight. The silicon wafers 62 were initially prepared on both sides with a 50–65-nm-thick Cr layer and a 200 nm thick Al layer. After the Ultradel adhesion promoter A600 was applied, the doped polyimide 60 was static dispensed, spun dried at 4000 rpm, and then baked at 175° C. to set the film. A second layer of polyimide was then applied in the same manner, improving the overall integrity and planarity of the dielectric layer 64. The final polyimide layer thickness was 5.9 $\mu$m. After the sample was baked at 100° C. and 175° C. to soft cure the polyimide, a top metal tri-layer 66 of TiW—Au—TiW was deposited. Alternately, a 100 nm thick Al layer can be deposited. The TiW alloy is 10% titanium and 90% tungsten, sputtered 40 nm thick. The gold layer is 1,000 nm thick. This tri-metal layer 66 serves as the top electrode during the poling process. After poling, the top electrode is patterned into circuit structures. Some of the samples received an additional layer of undoped polyimide to bury the circuit features as would be typical in an MCM substrate.

Several test samples were fabricated to measure the dopant's effect on the material properties of the host polyimide. The polymers used consisted of pure Ultradel 9020D polyimide, pure DuPont 2610 polyimide, Ultradel 9020D doped with 7.5% DCM, Ultradel 9020D doped with 12.5% DCM, and Ultradel 9020D doped with 17.5% DCM. All of the samples were fabricated on silicon carriers. The properties that were measured included the index of refraction, the dielectric constant and the loss tangent. Wafers having a single layer of cured polymer were used to measure the index of refraction. The dielectric constant and loss tangent measurements required stand-alone polymer films. Those samples were created by applying four coats of the polymer to a silicon wafer, curing the film, and them floating it off the wafer in boiling water. In each case, the pure polyimides were cured up to 300° C. and the doped polyimides were cured up to 235° C. The lower temperature for the doped films minimized the sublimation of the dopant.

The poling process consists of heating the polyimide substrate to a final cure temperature that can range up to its glass transition temperature ($T_g$~390° C.) while subjecting it to strong electric field to align the chromophores. With the electric field still applied, the samples were cooled to maintain the electric-field-induced alignment of the molecules. Test samples were heated to over 200° C. for 20 minutes with an electric field of 300 kV/cm. With the electric field still applied, the samples were cooled for 7 minutes. After poling, the top metal layer was patterned and etched using standard photolithographic techniques.

Figure 4:
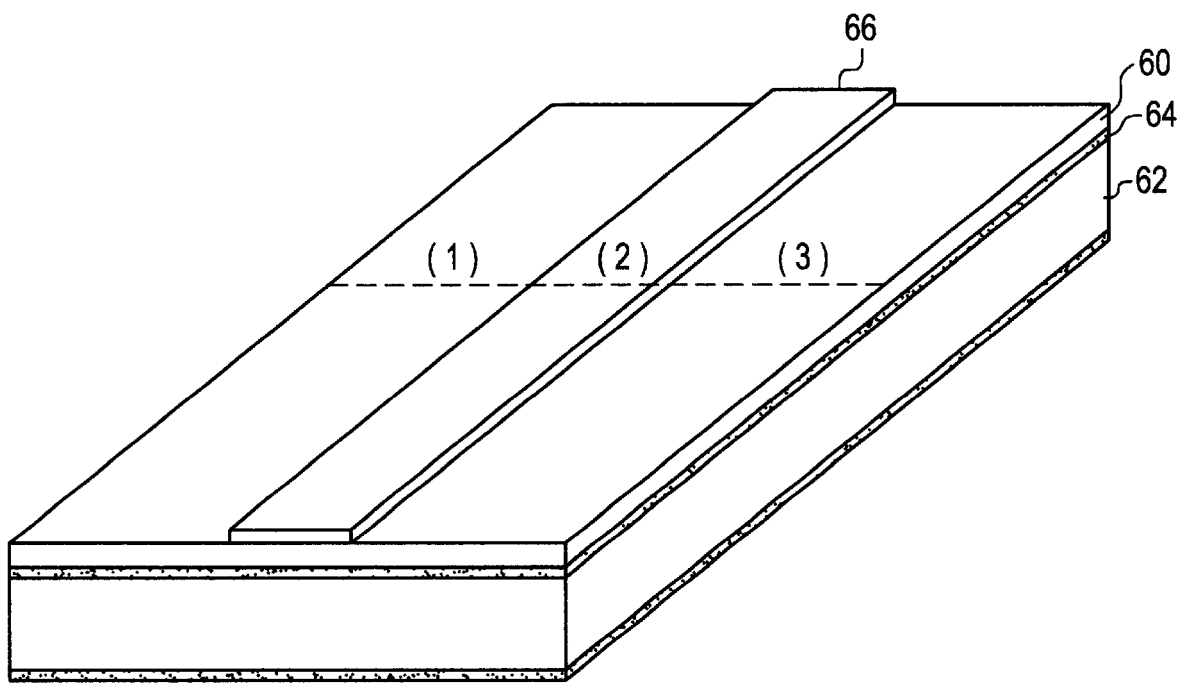
FIG. 4 shows the path a laser scans as the voltage is probed along a micro-strip circuit sample.
Figure 5:
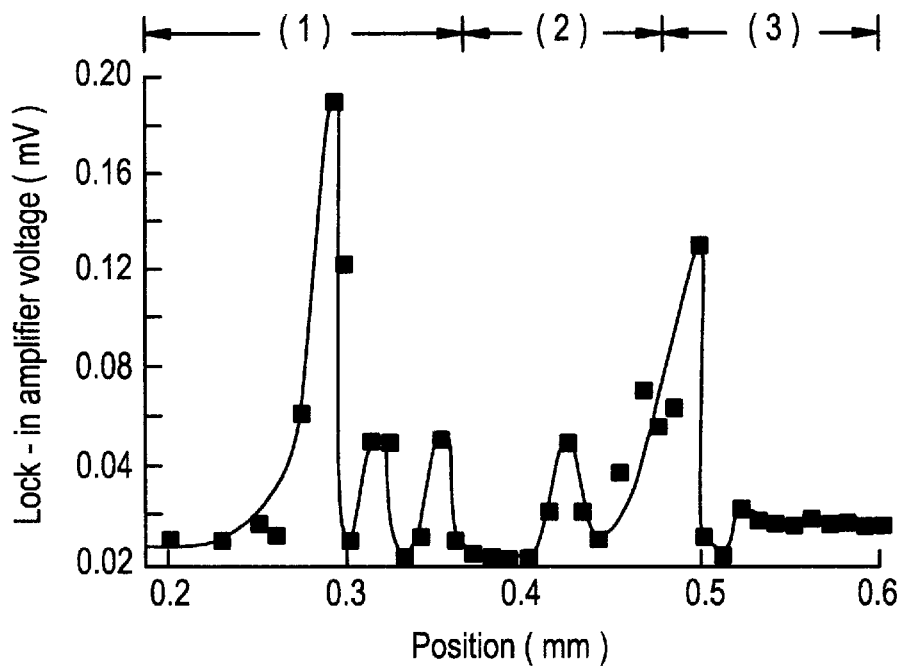
FIG. 5 is a graph of test results from laser electro-optic probing scans across transmission lines with sinusoidal signals for a polyimide substrate.
Figure 6:
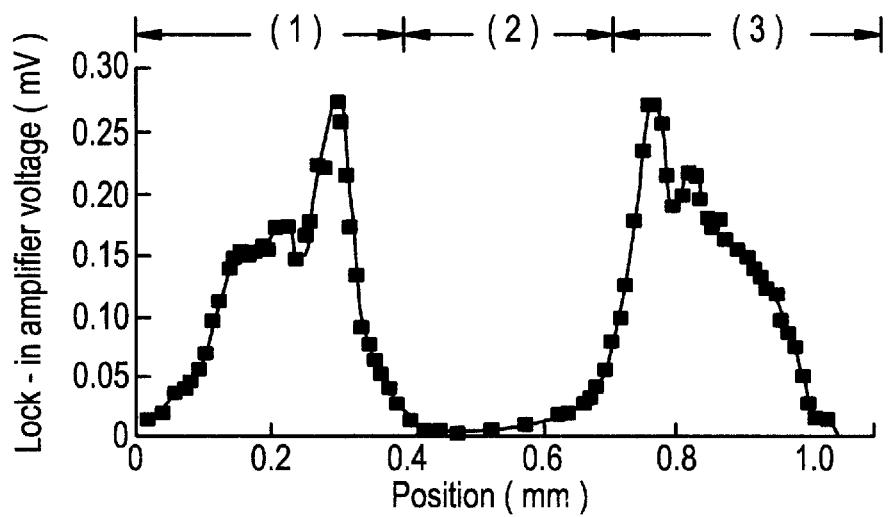
FIG. 6 is a graph of test results from laser electro-optic probing scans across transmission lines with sinusoidal signals for a GaAs substrate.
Figure 7:
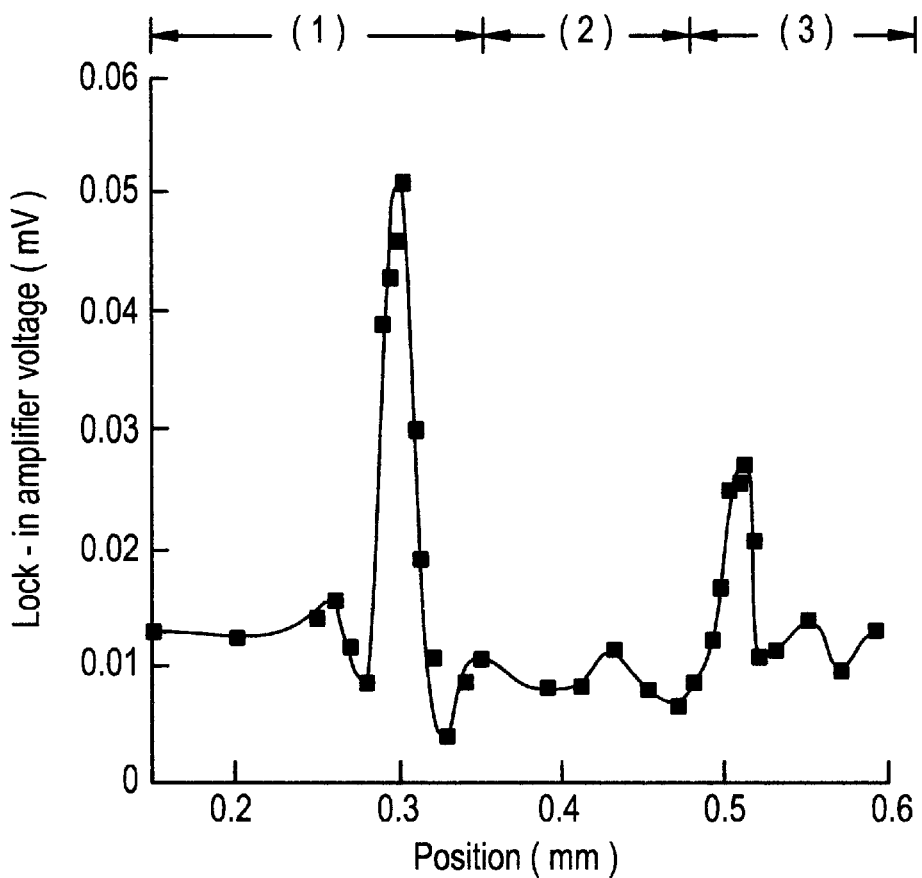
FIG. 7 is a graph of the electro-optic probing results for a scan across the transmission line using a 10% duty cycle digital signal.

FIG. 4 shows the path a laser scans as the voltage is probed along the micro-strip circuit sample. FIG. 5 is a graph of test results from laser electro-optic probing scans across transmission lines with sinusoidal signals, for a polyimide substrate. The graph shows the lock-in amplifier 48 output versus the position of the laser probe 32 for an RF signal. FIG. 6 is a graph of test results from electro-optic probing scans across transmission lines with sinusoidal signals for a GaAs substrate. The graph shows the lock-in amplifier 48 output versus the position of the laser probe 32 for an RF signal. The numbered positions are related to those in FIG. 4. As the laser scans across the transmission lines at position 2 the test results show no signal since the laser does not penetrate 62 into the substrate when it is reflected from the circuit metallization on top of the substrates. As expected, there is a strong electric field on each side of the transmission lines that decreases as the scan moves away from each line. The polyimide circuit was also excited with a 10% duty cycle digital signal. FIG. 7 shows the electro-optic probing results for a scan across the transmission line using the 10% duty cycle digital signal. The graph shows the lock-in amplifier 48 output versus the laser probe position.

Figure 8:
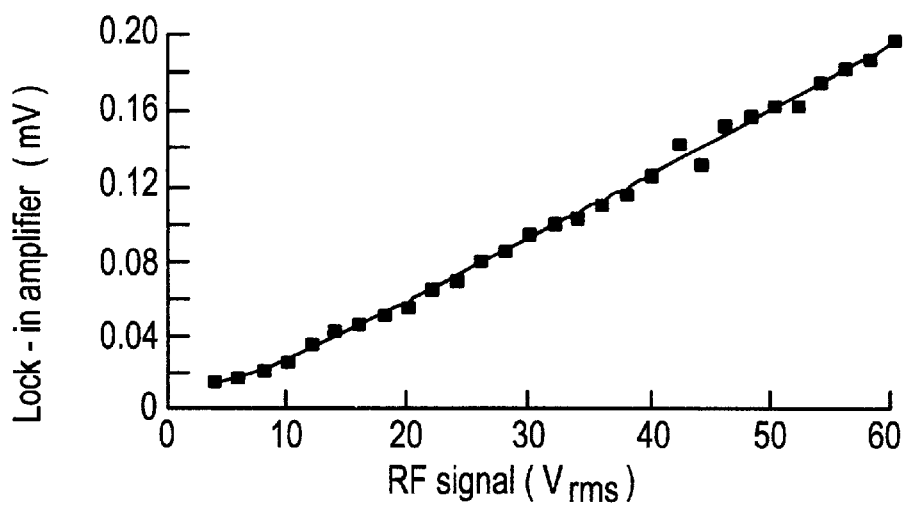
FIG. 8 is a calibration curve for a polyimide sample showing that the curve for a typical polyimide sample is linear with the RF signal reduced to 3 volts.

The RF signals provided to the micro-strip samples ranged up to 60 $V_{rms}$. The digital signal had a peak value of 100 V. The calibration curve for a typical polyimide sample is shown in FIG. 8. This shows that electro-optic probing results are linear with the RF signal reduced to 3V.

Electro-optic probing test results show that samples with dopant levels as high as 17.5% exhibited a stronger electro-optic response. A highest possible curing temperature is preferred to produce highly mechanically stable dielectric layers. However, samples doped with polyimide at levels as high as 17.5% by weight could not be poled at curing temperatures above 235° C. using a sputtered metal top electrode. The polymer film wrinkles and cracks above 235° C. In addition, higher dopant levels degrade the glass transition temperature. Polyimide doped at a 12.5% level and poled with a sputtered top electrode maintained its integrity up to 260° C. This suggests that the doped polymer is thermally altered by the degree of sublimation of the dopant. Lower dopant levels gave weaker electro-optic response but were thermally stable. Thus, the polyimide should be doped at 17.5% or lower.

GaAs and InP semiconductor substrates were used to compare previous results with those of the organic polymer of the present invention. These semi-insulating, 450–500 $\mu$m thick semiconductor substrates had a Cr/Au base metallization with plated gold transmission lines.

The magnitude of the change in index is proportional to the size of the electro-optic coefficients for the material, with the electro-optic coefficient established by the poling process for the polyimide sample. A 1300 nm diode laser was used to probe the electric field internal to the substrates.

Electro-optic probing of GaAs is a well established technique and has been reported with electro-optic coefficients of 1.4 pm/V. A comparison of electro-optic test results for GaAs, InP and Ultradel 9020D doped with DMC shows an electro-optic effect for the polyimide that is the same order of magnitude as that of the GaAs sample in the 45° test sample orientation. The electro-optic effect can be improved beyond that that of GaAs and InP by poling the polyimide with a stronger electric field.

A comparison of the laser probing scans of the GaAs and the polyimide samples shows that the polyimide samples for both the RF and digital signals, has a narrower electric field with small perturbations near the transmission line. The results are most likely due to laser heating of the substrate and electric field fringing effects.

Figure 9:
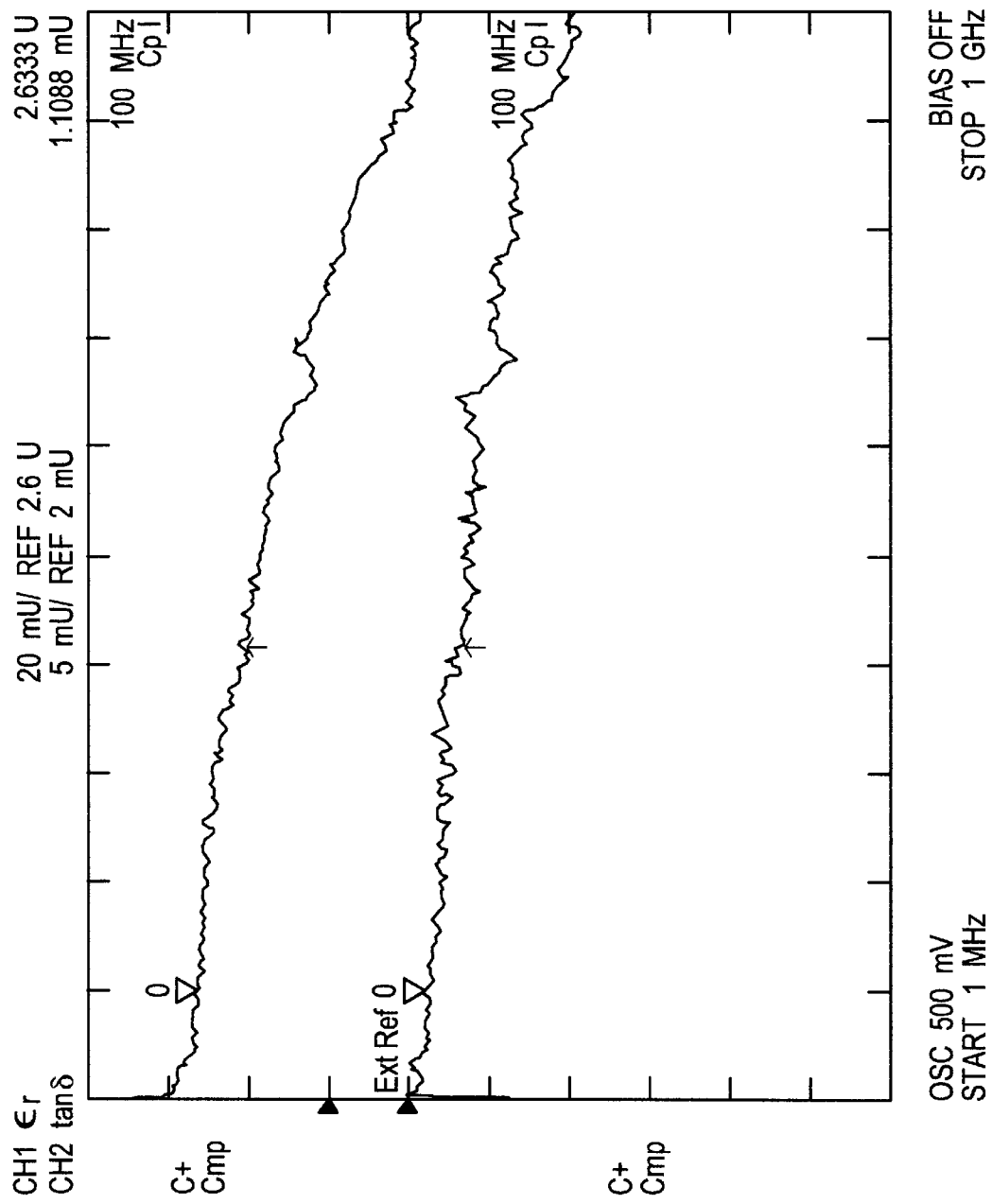
FIG. 9 is a graph showing the dielectric constant and loss tangent for DuPont 2610.
Figure 10:
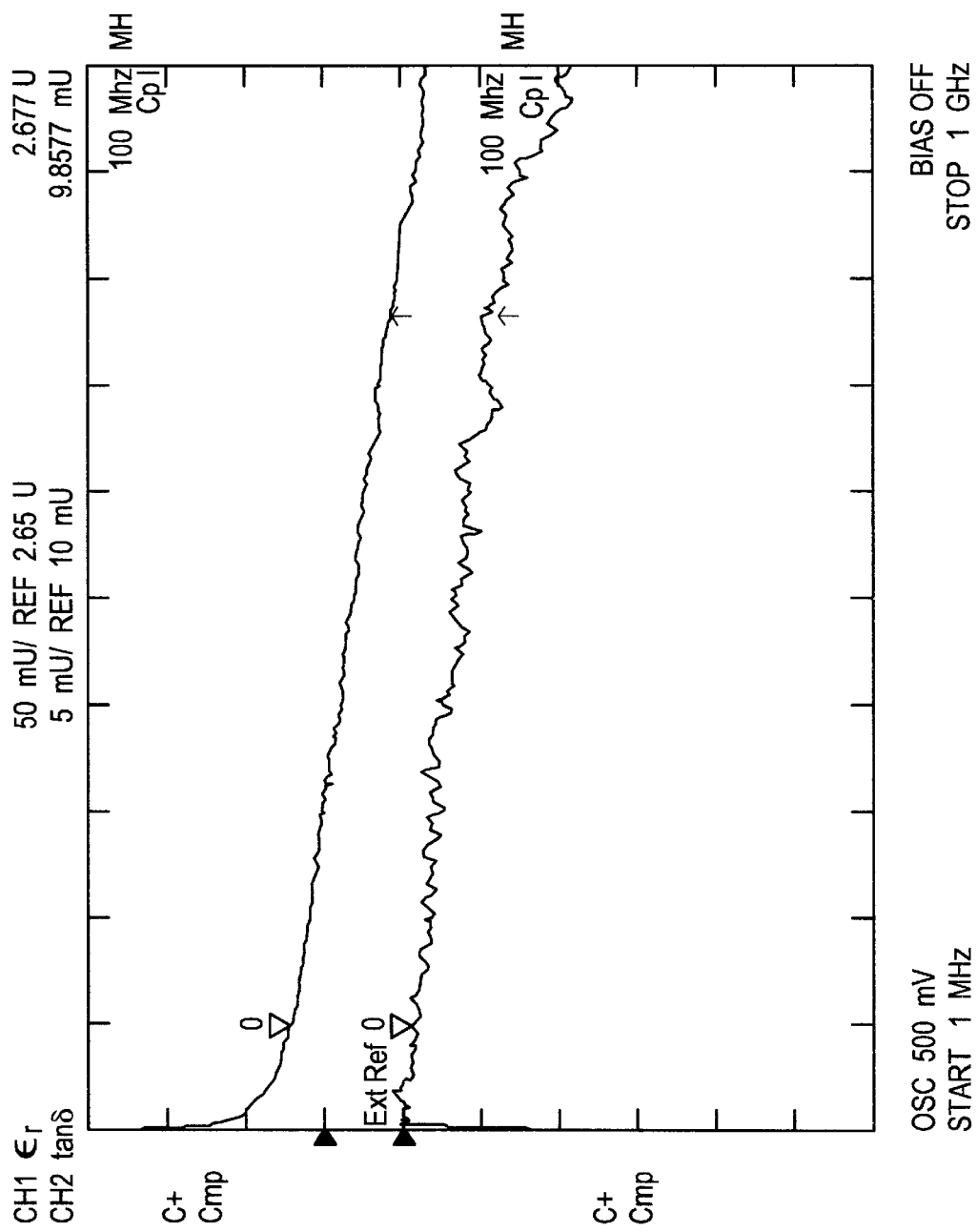
FIG. 10 is a graph showing the dielectric constant and loss tangent for Ultradel 9020D.
Figure 11:
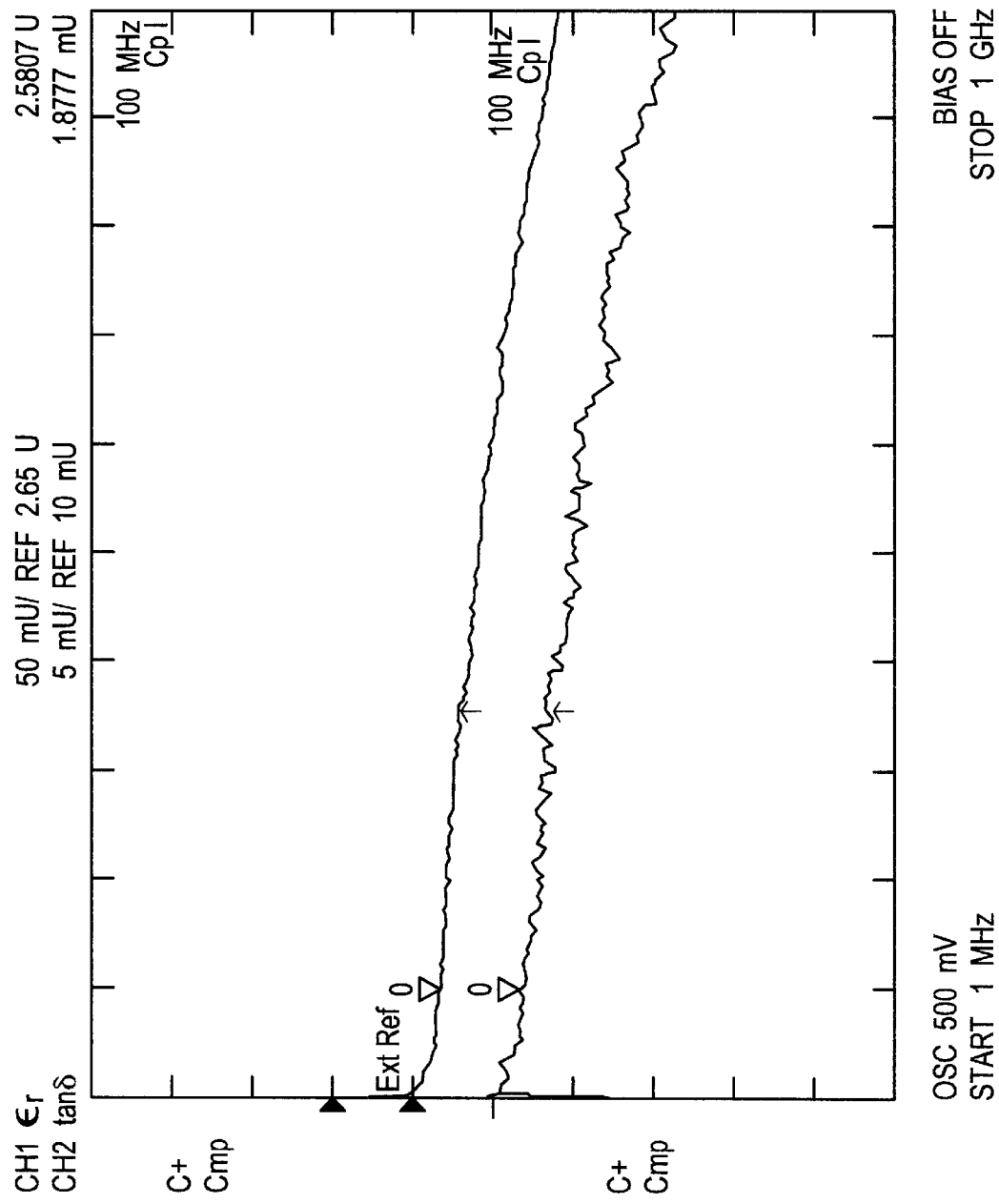
FIG. 11 is a graph showing the dielectric constant and loss tangent for Ultradel 9020D doped with 17.5% DCM by weight.

Test results demonstrate that electro-optic probing may be used for both analog and digital waveforms on polyimide substrates and for on-substrate testing of polyimide to determine the electric field. The dielectric constant and loss tangent for doped and poled polyimide was measured and the results are shown in FIGS. 9–11 for the various polyimides. FIGS. 9–11 show the dielectric constant and loss tangent for DuPont 2610, Ultradel 9020D and Ultradel 9020D doped with 17.5% DCM by weight, respectively, with the frequency swept from 1 MHz to 1 GHz for each of the test samples. FIG. 9 shows that at 100 MHz DuPont 2610 has a dielectric constant of 2.63 and loss tangent of 0.001. As frequency increases to 1 GHz the dielectric constant decreases to 2.58. FIG. 10 shows that at 100 MHz pure Ultradel has a dielectric constant of 2.68 and FIG. 11 shows that at 100 MHz doped Ultradel has a dielectric constant of 2.58. At 1 GHz the pure Ultradel dielectric constant is 2.59 as shown in FIG. 10 and the doped Ultradel dielectric constant is 2.51 as shown in FIG. 11. Measurement of insertion loss for devices constructed on doped and undoped polyimide shows increased loss for the doped and poled circuit samples. Further, the test results demonstrate that electro-optic probing may be used for on-substrate testing of polyimide to determine the electric field. A change in laser light intensity determines the strength and location of the electric field created by the electric signal applied to the probed circuit structures. Many potential applications exist for this non-invasive technique since the laser is able to penetrate substrates for testing. The technique allows probing of circuit structures on polyimide substrates and demonstrates the potential to probe circuit structures that are buried in the center layers of an MCM. This information is used to test for faults, for characterizing circuits and for modeling MCMs. Test results further indicate that the electrical properties were not substantially changed by the introduction of chromophores. The index of refraction is dependent on dopant level.

Typical polymers that exhibit the electro-optic effect after poling include conditioned photosensitive polymers such as PMMA. While these polymers are common in processing of semiconductor wafers, they are typically not part of the packaging structure. Similarly, certain key packaging polymers such as polyimide and BCB exist in photosensitive forms. Thus, noninvasive laser probing of the electric fields in a series of test circuits built on doped and poled polyimide dielectric layers prove helpful in diagnosing and testing module performance. The efficacy of the doped polyimide as a dielectric layer and an electro-optic material shows there is a trade-off between the level of dopant and the thermal characteristics of the material. The dopant mildly influences the electrical properties. The electro-optic effects last two or more years.

The foregoing is considered as illustrative only of the principles of the invention. Further, since numerous modifications and changes will readily occur to those skilled in the art, it is not desired to limit the invention to the exact construction and applications shown and described, and accordingly, all suitable modifications and equivalents may be resorted to, falling within the scope of the invention and the appended claims and their equivalents.

What is claimed is:

1. A multi-chip module circuit structure, comprising:
   a substrate;
   a metal layer formed on said substrate;
   a plurality of chromophore doped polyimide interlayer dielectric layers formed on said metal layer, said chromophore doped polyimide interlayer dielectric layers being poled in a strong electric field;
   patterned metal conductors formed on each of said plurality of chromophore doped polyimide interlayer dielectric layers; and
   an electro-optic probe for non-invasively probing said multi-chip module.

2. A multi-chip module circuit according to claim 1, wherein said substrate is silicon.

3. A multi-chip module circuit according to claim 2, wherein said silicon substrate comprises p-type, boron doped, (100) orientation having a resistivity between 25–30 ohm-cm and a thickness between 14.0–16.0 $\mu$m.

4. A multi-chip module circuit according to claim 1, where said metal layer comprises one of Al, CrAu, and TiW—Au—TiW.

5. A multi-chip module circuit according to claim 1, where in said chromophore doped polyimide interlayer dielectric layers comprise a polyimide of Ultradel 9020D.

6. A multi-chip module circuit according to claim 5, wherein said polyimide is doped with 4-(dicyanomethylene)-2-methyl-6-(p-dimethylaminostyryl)-4H-pyran (DCM).

7. A multi-chip module circuit according to claim 1, where in said chromophore doped polyimide interlayer dielectric layers comprise a polyimide of DuPont 2610.

8. A multi-chip module circuit according to claim 1, wherein said chromophore doped polyimide interlayer dielectric layers comprise benzocyclobutene (BCB).

9. A multi-chip module circuit structure according to claim 1, wherein said electro-optic probe measures the change in the index of refraction of said chromophore doped polyimide interlayer dielectric layers due to a change to the local electric field.

10. A method for non-invasive testability of a multi-module circuit structure, comprising the steps of:
    a) forming a multi-module circuit structure including a plurality of chromophore doped polyimide dielectric layers formed on a metal layer and substrate;
    b) forming patterned metal conductors on each of the plurality of chromophore doped polyimide dielectric layers;
    c) poling the chromophore doped polyimide dielectric layers in a strong electric field; and
    d) focusing a laser probe near or on each of the patterned metal conductors for diagnosing module performance.

11. A method for non-invasive testability of a multi-module circuit structure, comprising the steps of:
    a) forming a multi-module circuit structure including a plurality of chromophore doped polyimide dielectric layers formed on a metal layer and substrate;
    b) forming patterned metal conductors on each of the plurality of chromophore doped polyimide dielectric layers;
    c) poling the chromophore doped polyimide dielectric layers in a strong electric field; and
    d) electro-optic probing the multi-module circuit structure for measuring changes in the index of refraction of the chromophore doped polyimide dielectric layers due to a change in the local electric field.

* * * * *